United States Patent
Liou

(10) Patent No.: US 6,548,230 B1
(45) Date of Patent: Apr. 15, 2003

(54) METHOD FOR IN-SITU REMOVAL OF PHOTORESIST AND SIDEWALL POLYMER

(75) Inventor: Shu-Hong H. Liou, Kao-Hsioung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 171 days.

(21) Appl. No.: 09/156,354

(22) Filed: Sep. 18, 1998

(51) Int. Cl.[7] .............................. G03C 5/00; C25F 5/00
(52) U.S. Cl. ..................... 430/329; 134/1.1; 134/1.2
(58) Field of Search ..................... 430/329; 134/1.1, 134/1.2

(56) References Cited

U.S. PATENT DOCUMENTS 6,068,784 A * 4/1993 Collins et al. ............... 216/68
5,240,554 A * 8/1993 Hori et al. ................... 156/643
5,578,164 A * 11/1996 Kurono et al. ............ 156/643.1
5,925,577 A * 7/1999 Solis ........................... 438/725

FOREIGN PATENT DOCUMENTS

WO          97/11482     * 3/1997

* cited by examiner

Primary Examiner—Stuart L. Hendrickson
Assistant Examiner—Jonas N. Strickland
(74) Attorney, Agent, or Firm—Tung & Associates

(57) ABSTRACT

A method for in-situ removal of unwanted coating layers from a wafer surface by utilizing a magnetic field enhanced plasma is disclosed. The unwanted coating layers may include, but are not limited to, photoresist coating layers and sidewall passivation polymer layers. The magnetic field can be generated at a flux density between about 10 gauss and about 100 gauss. The wafer surface is exposed to the magnetic field enhanced plasma ions for a time period until substantially all the unwanted coating layers are removed, i.e., in a time period between about 1/2 minute and about 10 minutes. An oxygen plasma is used for demonstrating the method.

19 Claims, 1 Drawing Sheet

METHOD FOR IN-SITU REMOVAL OF PHOTORESIST AND SIDEWALL POLYMER

FIELD OF THE INVENTION

The present invention generally relates to a method for in-situ removal of unwanted film layers from a semiconductor substrate and more particularly, relates to a method for in-situ removal of photoresist layers and sidewall polymers from a surface of a wafer in a photoresist strip chamber by adding a magnetic field in the chamber to increase the ion energy of the plasma ions generated such that both the photoresist layers and the sidewall passivation layers of polymer are removed simultaneously.

BACKGROUND OF THE INVENTION

In the fabrication of semiconductor devices, various processing steps are started with a photolithography process for defining a circuit on the wafer. For instance, in modern memory devices, many layers of metal conductors are required for providing a multi-layer metal interconnection structure. As the number of layers of metal interconnections increase, and as the device geometry is continuously being reduced to allow more densely packed circuits, the photolithography process required to define patterns of circuits becomes more complicated and difficult to carry out.

In a process for forming metal vias or lines on an insulating layer on a wafer, not only must also be removed. The sidewall passivation layer is normally used to enhance the etch directionality and to improve the anisotropy. It is carried out by adjusting an etchant gas composition and reactor parameters such that an etch-inhibiting film can be formed on the vertical sidewalls of a via or hole. The passivation film slows down or completely stops lateral etching by the etchant gas while the etching of horizontal surfaces continues. Any oxide growth is prevented on horizontal surfaces since the surfaces are exposed to ion bombardment. Similarly, sidewall passivation films can be deposited by choosing a greater elemental ratio or carbon to fluorine in a fluorocarbon plasma. When a suitable chemistry is selected, involatile polymer films can be deposited on the sidewalls of via or line cavities to form a coating that blocks attack from etchant gas. While polymer film may also deposit on the horizontal surfaces, the film is removed by ion bombardment and thus allowing a continuing etching of such surfaces. The sidewall passivation is a very useful method for preserving linewidth control especially when an isotropic etchant such as fluorine or chlorine gas is used.

After a via or line etching process is completed, the sidewall passivation layer of a polymeric material must be removed before the wafer can be further processed. In a conventional method, the sidewall polymer cannot be removed in a photoresist strip chamber where only a microwave or a decoupled source plasma is used for stripping photoresist layer after metal etching. Such a photoresist strip process does not remove sidewall polymer films that was formed for sidewall passivation. It is therefore necessary to subject the wafer to a separate wet etching process for removing the sidewall polymer. For instance, a wet stripper process can be implemented after a photoresist stripping process by utilizing wet etchant such as ACT® 690C or EKC® 265 to remove the sidewall polymer after a metal etching process and a photoresist strip process. The ACT® 690C is a mixture of DMSO (dimethyl-sulphur-oxide), MEA (mono-ethyl-amine) and catechol, while EKC® 265 is a mixture containing HDA (hydroxy-amine). The wet etching process is both time consuming and may cause other problems to the circuits already formed on the wafer surface. Moreover, as the device dimension is gradually reduced to the 0.25 $\mu$m scale, the sidewall polymer passivation layer becomes more difficult to remove in a wet stripping process due to the reduced via size or linewidth in those devices.

It is therefore an object of the present invention to provide a method for in-situ removal of unwanted coating layers from the surface of a semiconductor substrate without the drawbacks or the shortcomings of the conventional method.

It is another object of the present invention to provide a method for in-situ removal of unwanted coating layers from the surface of a semiconductor substrate in a photoresist strip chamber.

It is a further object of the present invention to provide a method for in-situ removal of unwanted coating layers from a semiconductor substrate in a photoresist strip chamber equipped with magnetic field enhancement.

It is another further object of the present invention to provide a method for in-situ removal of photoresist and sidewall polymer from a wafer surface in a photoresist strip chamber by switching on a magnetic field having a substantially constant flux density and maintaining such field until substantially all unwanted films are removed from the wafer.

It is still another object of the present invention to provide a method for in-situ removal of photoresist and sidewall polymer from a wafer surface by producing a magnetic field in a photoresist strip chamber and maintaining a flux density of at least 10 gauss.

It is yet another object of the present invention to provide a method for in-situ removal of photoresist and sidewall polymer from a wafer surface by subjecting the wafer to an oxygen plasma which has increased ion energy by switching on a magnetic field.

It is still another further object of the present invention to provide a method for removing unwanted coating layers from a wafer surface by subjecting the wafer to plasma ions of substantially oxygen in a magnetic field that has a flux density of at least 10 gauss.

It is yet another further object of the present invention to provide a method for in-situ removal of unwanted coating layers from a pre-processed semiconductor substrate by subjecting the semiconductor substrate to an oxygen plasma maintained in a magnetic field having a flux density of at least 20 gauss for a time period of not less than ½ minute.

SUMMARY OF THE INVENTION

In accordance with the present invention, a method for in-situ removal of layers of photoresist and sidewall polymer from a wafer surface is provided.

In a preferred embodiment, a method for in-situ removal of photoresist and sidewall polymer from a wafer surface can be carried out by the operating steps of first positioning a pre-processed wafer in a process chamber, flowing an etch gas into the chamber, igniting a plasma and generating plasma ions of the etch gas, producing a magnetic field which has a substantially constant flux density, and maintaining the substantially constant flux density for a predetermined length of time until substantially all photoresist and sidewall polymer are removed from the wafer.

The etch gas may include oxygen, or oxygen and water, or oxygen, water and nitrogen. The pre-processed wafer may have metal lines defined on top. The plasma ions generated may be substantially oxygen ions. The substantially constant flux density is at least 10 gauss, or between about 10 gauss and 100 gauss. The predetermined length of time is at least ½ minute, or between about ½ minute and about 10 minutes. The substantially constant flux density may be 20 gauss which is maintained for a length of time of about 3 minutes.

In another preferred embodiment, the present invention method for removing unwanted coating layer from a wafer surface can be carried out by first providing a pre-processed wafer that has unwanted coating layers on top in a process chamber, flowing an etch gas including oxygen into the process chamber, igniting a plasma in the etch gas and generating plasma ions of substantially oxygen, generating a magnetic field which has a flux density of at least 10 gauss in the chamber, and maintaining the flux density for a length of time until substantially all the unwanted coating layers are removed from the wafer.

The unwanted layers may include, but not limited to, photoresist coating layers and sidewall polymer passivation layers. The process chamber utilized may be a photoresist etch chamber. The etch gas may include oxygen and water, or oxygen, water and nitrogen. The magnetic field generated may have a flux density of between about 10 gauss and about 100 gauss. The length of time that the wafer is exposed to the magnetic field enhanced plasma is at least ½ minute.

In still another preferred embodiment, a method for in-situ removal of unwanted coating layers from a pre-processed semiconductor substrate can be carried out by the steps of positioning a pre-processed semiconductor substrate in a plasma etch chamber, flowing an etch gas that includes oxygen into the chamber, igniting a plasma and generating plasma ions of substantially oxygen, switching on a magnetic field to produce a flux density of at least 10 gauss, and increasing the ion energy of the plasma ions of substantially oxygen and maintaining such energy for a length of time until the unwanted coating layers are removed from the pre-processed semiconductor substrate. The flux density generated by the magnetic field may be between about 10 gauss and about 100 gauss.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for in-situ removal of photoresist and sidewall polymer layers from a wafer surface by subjecting the wafer to plasma enhancement in a magnetic field for the simultaneous removal. The present invention novel method provides the capability of removing photoresist and sidewall polymer layers in a single photoresist stripping process such that a wet stripping normally required for removing the sidewall polymer can be eliminated. By eliminating the wet stripping step, the semiconductor fabrication process can be simplified, can be safer to operate and furthermore, can be carried out without environmental pollution by the wet etchant. The present invention novel method therefore provides a valuable means for removing unwanted film layers from a wafer that is substantially more efficient than the conventional method of first using microwave or decoupled source plasma for stripping a photoresist layer and then using wet stripping for removing sidewall polymer layers.

Figure 1:
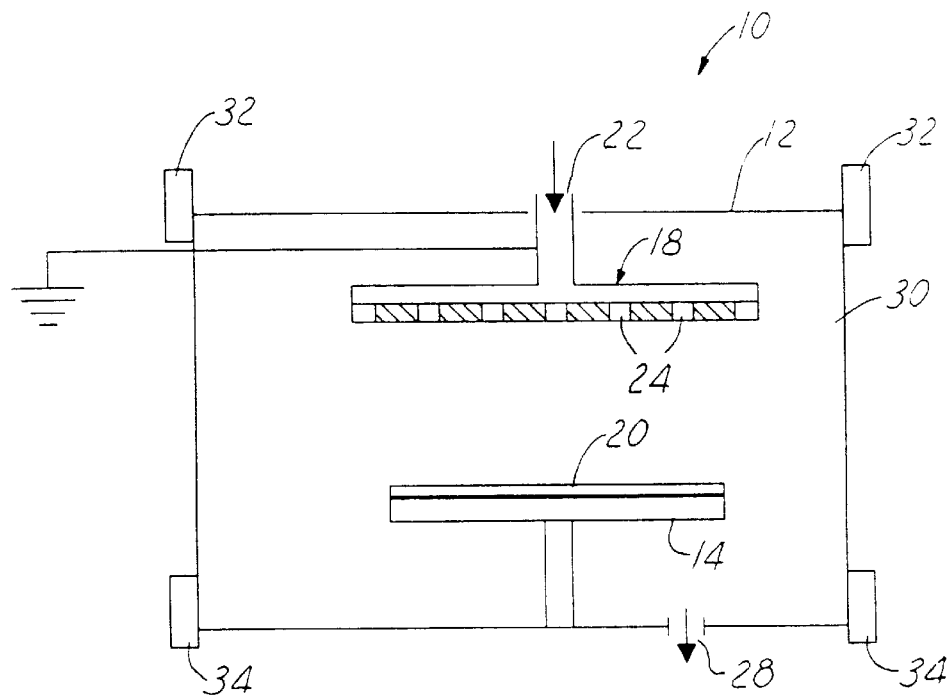
FIG. 1 is an illustration of a side view of a plasma process chamber equipped with magnetic field enhancement.

Referring initially to FIG. 1, wherein a schematic view of a plasma process chamber 10 is shown. The plasma process chamber, or plasma etch reactor 10 includes a housing 12 which is typically made of a non-magnetic material such as aluminum to define the plasma process chamber. Wafer platform 14 also acts as a cathode. A gas inlet nozzle 18, or a showerhead, functions as an anode. Reaction gases are flown into the chamber 10 through a gas inlet 22 to the showerhead 18. The showerhead 18 is also known as a manifold plate in the semiconductor fabrication industry. A semiconductor wafer 20 that is to be processed is positioned on the wafer support, or cathode 14. The wafer 20 is normally mounted on the wafer support 14.

During a plasma process, the wafer 20 is heated up and therefore must be cooled by a cooling gas (not shown) while the wafer transfers heat to the water cooled wafer platform 14. The wafer 20 is normally held down on the platform 14 against a cooling gas pressure during the plasma processing. An exhaust gas outlet 28 which is normally connected to a vacuum pump (not shown) is used to evacuate the process chamber 10. To enable the present invention method to be carried out, an upper rotating magnet 32 and a lower rotating magnet 34 are used to generate a magnetic field inside the process chamber 10. It should be noted that while a rotating magnet configuration is shown in FIG. 1, any other magnetic field generating means including that of stationary coils may also be used.

In performing the present invention novel method, after a metal etching process is completed, the wafer is positioned in a photoresist strip chamber 10 as the one shown in FIG. 1. An etch gas which includes at least oxygen is then fed through a gas inlet port 22 into the chamber cavity 30 through the showerhead 18 and a multiplicity of outlet nozzles 24 provided in the showerhead 18. The oxygen etch gas may further include $H_2O$ and/or a small amount of $N_2$. A plasma of the gas ions which consists substantially of $O_2$ is formed in a space between the showerhead 18 and the wafer 20 while, simultaneously, cooling gas is supplied to the bottom side of the wafer 20. The plasma of the gas ions formed do not have sufficient ion energy to dislodge or remove both the photoresist coating layer on top of the wafer surface and the sidewall passivation layer of polymer in the via or line cavities.

The present invention novel method for removing unwanted coating layers from a wafer surface can be carried out by providing a magnetic field generating device to a plasma chamber. One of such magnetic field generating device consists of an upper rotating magnet 32 and a lower rotating magnet 34 is shown in FIG. 1. When the rotating magnets 32, 34 are switched on, a magnetic field which has a substantially constant flux density is produced in the chamber cavity 30 of the plasma chamber 10. By adjusting the rotating speed of the magnets 32, 34, the strength of the magnetic field as indicative by a flux density reading can be suitably controlled. For instance, in the present invention novel method, a flux density between about 10 gauss and about 100 gauss is a desirable range for the present invention novel method. It was discovered that the ion energy of the oxygen plasma can be increased significantly to improve its removal efficiency of the unwanted coating layers from the wafer. The improved ion energy of the oxygen plasma ions can be used efficiently to dislodge coating layers from either the top of the wafer surface (e.g., the photoresist layer) or the via or line cavities (e.g., the sidewall passivation polymer).

Figure 2:
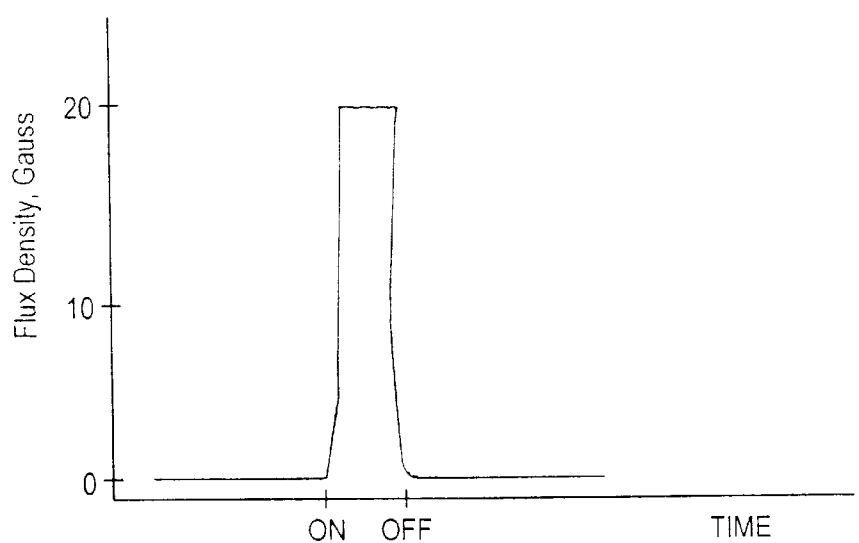
FIG. 2 is a graph illustrating the present invention method of using a magnetic field to increase ion energy of the plasma ions for etching photoresist layers and sidewall polymer layers simultaneously in an etch chamber.

As shown in FIG. 2, the present invention novel method of switching on a magnetic field in a plasma process chamber to further enhance the cleaning capability of a gas plasma of oxygen is demonstrated. After a magnetic field is switched on, e.g., to a flux density of approximately 20 gauss, the flux density is kept on for a time period of at least ½ minute, or until the unwanted coating layers have been dislodged or otherwise removed from the wafer surface. It has been found through experimentation that a minimum flux density of 10 gauss is normally required for removing unwanted layers and, as high as 100 gauss may be utilized for such purpose. The removal time required in a magnetic field generated may be anywhere between about ½ minute and about 10 minutes. A typical setting may be a flux density of between 10 and 20 gauss for a time period between 2 and 3 minutes.

The present invention novel method for the in-situ removal of unwanted coating layers by utilizing magnetic field enhanced plasma ions can be advantageously used in any plasma process chamber that is equipped with magnetic enhancement. The present invention novel method can be further applied to those process chambers where magnets can be attached in a deposition chamber or in an in-situ cleaning process used in a chemical vapor deposition or physical vapor deposition system.

The present invention novel method was illustrated in an etch chamber to demonstrate the effectiveness of magnetic field enhancement in coating layer removal. A typical etch chamber used is one supplied by the Applied Materials Corporation in Santa Clara, Calif., a Precision 5000® machine. In this specific chamber, a magnetic flux density was maintained at any range between about 10 gauss and about 100 gauss, for a time period between about ½ minute and about 10 minutes. The temperature and pressure of the chamber that it is operated under during the present invention novel cleaning process is the same as those normally used in an etch process. For instance, a temperature range between about 25° C. and about 400° C. and a pressure range between about 10 m Torr and about 1,000 m Torr. The present invention novel cleaning method has been demonstrated on various photoresist coating layers and various sidewall polymer layers with equally satisfactory results.

While the present invention has been described in an illustrative manner, it should be understood that the terminology used is intended to be in a nature of words of description rather than of limitation.

Furthermore, while the present invention has been described in terms of a preferred embodiment and two alternate embodiments, it is to be appreciated that those skilled in the art will readily apply these teachings to other possible variations of the inventions.

The embodiment of the invention in which an exclusive property or privilege is claimed are defined as follows:

1. A method for in-situ removal of photoresist and sidewall polymer from a wafer comprising the steps of:
   positioning a pre-processed wafer in a process chamber,
   flowing an etch gas into said chamber,
   igniting a plasma and generating plasma ions isotropically of said etch gas,
   producing a magnetic field having a constant flux density, and
   maintaining said constant flux density for a length of time between about ½ minute and about 10 minutes and removing photoresist and sidewall polymer from said wafer.

2. A method for in-situ removal of photoresist and sidewall polymer from a wafer according to claim 1, wherein said etch gas comprises $O_2$.

3. A method for in-situ removal of photoresist and sidewall polymer from a wafer according to claim 1, wherein said etch gas comprises $O_2$ and $H_2O$.

4. A method for in-situ removal of photoresist and sidewall polymer from a wafer according to claim 1, wherein said etch gas comprises $O_2$, $H_2O$ and $N_2$.

5. A method for in-situ removal of photoresist and sidewall polymer from a wafer according to claim 1, wherein said pre-processed wafer having metal lines defined on a top surface of the wafer.

6. A method for in-situ removal of photoresist and sidewall polymer from a wafer according to claim 1, wherein said plasma ions generated are $O_2$ ions.

7. A method for in-situ removal of photoresist and sidewall polymer from a wafer according to claim 1, wherein said constant flux density is 10 gauss.

8. A method for in-situ removal of photoresist and sidewall polymer from a wafer according to claim 1, wherein said constant flux density is between about 10 gauss and about 100 gauss.

9. A method for in-situ removal of photoresist and sidewall polymer from a wafer according to claim 1, wherein said predetermined length of time is ½ minute.

10. A method for in-situ removal of photoresist and sidewall polymer from a wafer according to claim 1, wherein said constant flux density is about 20 gauss which is maintained for a length of time of about 3 minutes.

11. A method for removing unwanted coating layers from a wafer comprising the steps of:
    positioning a pre-processed wafer having unwanted coating layers on top in a process chamber,
    flowing an etch gas comprising $O_2$ into said process chamber,
    igniting a plasma in said etch gas and generating plasma ions isotropically of $O_2$,
    generating a magnetic field having a flux density of at least 10 gauss in said chamber, and
    maintaining said flux density for a length of time until all the unwanted coating layers are removed from said wafer.

12. A method for removing unwanted layers from a wafer according to claim 11, wherein said unwanted layers comprise photoresist coating layers and sidewall polymer layers.

13. A method for removing unwanted layers from a wafer according to claim 11, wherein said process chamber is a photoresist etch chamber.

14. A method for removing unwanted layers from a wafer according to claim 11, wherein said etch gas comprises $O_2$ and $H_2O$.

15. A method for removing unwanted layers from a wafer according to claim 11, wherein said etch gas comprises $O_2$, $H_2O$ and $N_2$.

16. A method for removing unwanted layers from a wafer according to claim 11, wherein said magnetic field generated has a flux density between about 10 gauss and about 100 gauss.

17. A method for removing unwanted layers from a wafer according to claim 11, wherein said length of time is ½ minute.

18. A method for in-situ removal of unwanted coating layers from a pre-processed semiconductor substrate comprising the steps of:
    positioning a pre-processed semiconductor substrate in a plasma etch chamber,
    flowing an etch gas comprising $O_2$ into said chamber,
    igniting a plasma and generating plasma ions isotropically of $O_2$,
    switching on a magnetic field to produce a flux density of at least 10 gauss, and
    increasing the ion energy of said plasma ions of substantially $O_2$ and maintaining such energy for a length of time until the unwanted coating layers are removed from said pre-processed semiconductor substrate.

19. A method for in-situ removal of unwanted coating layers from a pre-processed semiconductor substrate according to claim 18, wherein said flux density generated by said magnetic field is between about 10 gauss and about 100 gauss.

* * * * *